(12) United States Patent
Kawasaki

(10) Patent No.: US 6,331,828 B1
(45) Date of Patent: Dec. 18, 2001

(54) SIGNAL CONVERSION METHOD AND SIGNAL CONVERTERS

(75) Inventor: Hiroyuki Kawasaki, Hamamatsu (JP)

(73) Assignee: Kokochi Sangyo Co., Ltd., Hamamatsu (JP)

(*) Notice: Subject to any disclaimer, the term of this patent is extended or adjusted under 35 U.S.C. 154(b) by 0 days.

(21) Appl. No.: 09/377,314

(22) Filed: Aug. 19, 1999

(30) Foreign Application Priority Data

Aug. 20, 1998 (JP) .................................................. 10-234739

(51) Int. Cl.$^7$ ....................................................... H03M 7/02
(52) U.S. Cl. ......................... 341/83; 341/155; 364/746.2
(58) Field of Search ................................ 341/144, 155, 341/83; 364/746.2

(56) References Cited

U.S. PATENT DOCUMENTS

| | | | |
|---|---|---|---|
| 4,110,831 | 8/1978 | Langdon, Jr. ...................... | 364/745 |
| 4,229,801 | 10/1980 | Whipple ............................. | 364/748 |
| 4,488,252 | 12/1984 | Vassar ................................ | 364/748 |
| 4,758,972 | 7/1988 | Frazier .............................. | 364/745 |
| 4,866,655 | 9/1989 | Nishiyama et al. ................ | 364/761 |
| 4,979,140 | 12/1990 | Darley ............................... | 364/768 |
| 5,031,136 | 7/1991 | Nishiyama et al. ............... | 364/746.2 |
| 5,153,847 | 10/1992 | Takagi et al. ..................... | 364/746.2 |
| 5,243,551 | 9/1993 | Knowles et al. .................. | 364/750.5 |
| 5,267,186 | 11/1993 | Gupta et al. ...................... | 364/748 |
| 5,317,755 | 5/1994 | Harley et al. ..................... | 395/800 |
| 5,570,309 | 10/1996 | Miyoshi et al. ................... | 364/746.2 |
| 6,232,894 | * 5/2001 | Kawasaki .......................... | 341/83 |

OTHER PUBLICATIONS

Norman S. Scott, "Computer Number Systems and Arithmetic" 1985, Title Page, Chapter 7, pp. 198–201.

* cited by examiner

Primary Examiner—Peguy JeanPierre
(74) Attorney, Agent, or Firm—Flynn, Thiel, Boutell & Tanis, P.C.

(57) ABSTRACT

Between digital data signals, which are expressed using a notation system of three digit symmetric binary numbers (named "HEN2"), and analog signals, at least one way, mutual, or other conversions are made. Three digit symmetric binary numbers (HEN2), are a combination of signals in which at least one of two adjacent digits, at any digit position of one or more digits of 2-based three digit redundant binary numbers with one signal of three digits {n, o, p} expressing a value {−1, 0, 1} as a one-digit signal, is a signal "o" expressing zero. Thus three digits {−1, 0, 1} are used instead of the two digit {0, 1} binary system used in conventional A/D or D/A converters.

8 Claims, 13 Drawing Sheets

Fig.3 (A)

| HEN2 | | | | | the decimal integers |
|---|---|---|---|---|---|
| one digit | two digits | three digits | four digits | five digits | |
| | | | | p o p o p | 21 |
| | | | | p o p o o | 20 |
| | | | | p o p o n | 19 |
| | | | | p o o p o | 18 |
| | | | | p o o o p | 17 |
| | | | | p o o o o | 16 |
| | | | | p o o o n | 15 |
| | | | | p o o n o | 14 |
| | | | | p o n o p | 13 |
| | | | | p o n o o | 12 |
| | | | | p o n o n | 11 |
| | | | p o p o | o p o p o | 10 |
| | | | p o o p | o p o o p | 9 |
| | | | p o o o | o p o o o | 8 |
| | | | p o o n | o p o o n | 7 |
| | | | p o n o | o p o n o | 6 |
| | | p o p | o p o p | o o p o p | 5 |
| | | p o o | o p o o | o o p o o | 4 |
| | | p o n | o p o n | o o p o n | 3 |
| | p o | o p o | o o p o | o o o p o | 2 |
| p | o p | o o p | o o o p | o o o o p | 1 |
| o | o o | o o o | o o o o | o o o o o | 0 |
| n | o n | o o n | o o o n | o o o o n | -1 |
| | n o | o n o | o o n o | o o o n o | -2 |
| | | n o p | o n o p | o o n o p | -3 |
| | | n o o | o n o o | o o n o o | -4 |
| | | n o n | o n o n | o o n o n | -5 |
| | | | n o p o | o n o p o | -6 |
| | | | n o o p | o n o o p | -7 |
| | | | n o o o | o n o o o | -8 |
| | | | n o o n | o n o o n | -9 |
| | | | n o n o | o n o n o | -10 |
| | | | | n o p o p | -11 |
| | | | | n o p o o | -12 |
| | | | | n o p o n | -13 |
| | | | | n o o p o | -14 |
| | | | | n o o o p | -15 |
| | | | | n o o o o | -16 |
| | | | | n o o o n | -17 |
| | | | | n o o n o | -18 |
| | | | | n o n o p | -19 |
| | | | | n o n o o | -20 |
| | | | | n o n o n | -21 |

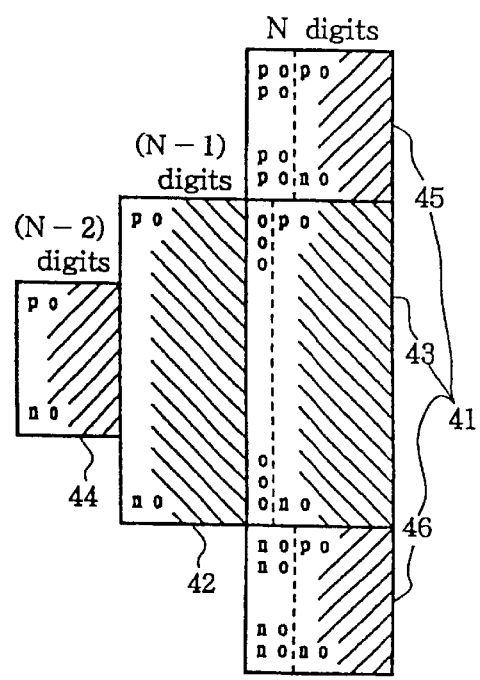

Fig.3 (B)

SIGNAL CONVERSION METHOD AND SIGNAL CONVERTERS

This application is related to commonly owned U.S. patent application Ser. No. 09/652,567, filed Aug. 31, 2000, titled "REPRODUCIBLE DATA CONVERSION AND/OR COMPRESSION METHOD OF DIGITAL SIGNALS AND A DATA CONVERTER AND A DIGITAL COMPUTER" which is a continuation-in-part of related commonly owned U.S. patent application Ser. No. 09/312,347, filed May 14, 1999, titled "REPRODUCIBLE DATA CONVERSION AND/OR COMPRESSION METHOD OF DIGITAL SIGNALS AND A DATA CONVERTER AND A DIGITAL COMPUTER".

FIELD OF THE INVENTION

This invention relates to an analog/digital (A/D) converter which converts analog signals to digital signals, and a digital/analog (D/A) converter which converts digital signals to analog signals, as well as a signal conversion method to be used therein. More specifically, the above-described converters are characterized in that they use, as digital data signals, an independent notation system of three digit symmetric binary numbers (hereinafter referred to as HEN2). A combination of such signals is selected from a 2-based three digit redundant binary number with each signal being one of three digits {n, o, p} each representing a value {−1, 0, 1} as a one-digit signal. At least one of two adjacent digits at any digit position of one or more digits is zero (the signal "o").

BACKGROUND OF THE INVENTION

As is well known, with most of the digital data signal processors according to the prior art, numbers of a two digit binary system using {0, 1} digit set are processed as digital data signals, and this is the same with A/D converters and D/A converters converting analog signals to digital data signals and vice versa.

Further, as is well known, with a part of digital computers, 2-based three digit redundant binary numbers using a three signal set {−1, 0, 1} as one digit are used for improvement. That is, to shorten operation time by an expected smaller frequency of carry digits than two digit binary numbers.

The Japanese Patent Application No. 133927/1998 (U.S. application Ser. No. 09/312,347) by the inventor has verified a one-to-one correspondence existing between the HEN2 (which is a combination of such signals, selected from a 2-based three digit redundant binary number with either one signal of three digits {n, o, p} each expressing a value {−1, 0, 1} as a one-digit signal. At least one of two adjacent digits at any digit position of one or more digits expresses zero (the signal "o")) and 2-based two digit binary numbers using {0, 1} digit set. This correspondence may allow analog signals to be converted to digital data signals having two digit binary numbers and then to digital data signals of the HEN2 type with one-to-one correspondence. Further, the correspondence may allow digital data signals of the HEN2 to be converted to digital data signals of the two digit binary number with one-to-one correspondence, and then to analog signals. But, either case must go through digital data signals of the two digit binary numbers, thus resulting in a longer time for conversion and necessitating a reduction of conversion time.

Further, since HEN2 and two digit binary numbers are different in their value ranges even with the same number of digits, mutual conversions between digital data signals of HEN2 and analog signals by way of digital data signals of the two digit binary numbers may not make full use of the characteristics of the HEN2 as digital data signals, thus necessitating a direct conversion between analog signals and digital data signals of HEN2.

SUMMARY OF THE INVENTION

In view of the aforementioned problems, this invention intends to provide a signal conversion method and signal converters which can make direct conversion between analog signals and digital data signals of the HEN2 with a shorter conversion time than the prior art.

To solve the problems, this invention is a signal conversion method, which uses, as digital data signals, an independent notation system of HEN2, which is a combination of signals selected from a 2-based three digit redundant binary number with either one signal of three digits {n, o, p} each expressing value {−1, 0, 1} as a one-digit signal. At least one of two adjacent digits at any digit position of one or more digits is zero (the signal "o"). Between the above digital data signals and analog signals, at least one way or mutual conversions are made, so that direct conversion can be made between analog signals and digital data signals of the HEN2 with shorter conversion time than the prior art.

In another embodiment, a region of the analog signals to be converted is determined. Then, the determined region is equally divided into four sections. At quarter sections at both ends, the respective digits to which the digital data signals correspond are made "p" and "n", while, at the intermediate two quarter sections, the respective digits are made "o", to determine the one-digit data signals of HEN2. When any digits are "p" or "n" (non-zero digits), the next digit becomes "o", thus obtaining "po" or "no". On the other hand, when any digits are "o", the range of analog signals corresponding thereto is equally divided into four sections. With the two end quarter sections, the corresponding digits of digital data signals are made respectively as "p" and "n", while with the two intermediate quarter sections are made to "o". Repetition of this process from higher order digits to lower order digits can determine the region of analog signals corresponding to individual values of digital data signals of HEN2 having a pre-determined number of digits. And then, between the above digital data signals and analog signals, at least one way or mutual conversions are made.

BRIEF DESCRIPTION OF THE DRAWINGS

FIG. 3(A) is an integer table showing the relation of digit numbers of HEN2 and decimal integers;

FIG. 3(B) is an arrangement of integer clusters and groups;

FIGS. 6(B) and 6(C) are illustrations showing the relation of digital data signals as output from the A/D converter and the range of analog signals corresponding to them;

DETAILED DESCRIPTION OF THE INVENTION

Referring to attached drawings, the following is the detailed description of embodiments for A/D converters which transform analog signals into digital data signals and a D/A converter which transforms digital data signals into analog signals, both representing the signal conversion methods and signal converters according to the invention. It goes without saying that this invention is not limited to the above exemplifications.

Figure 1:
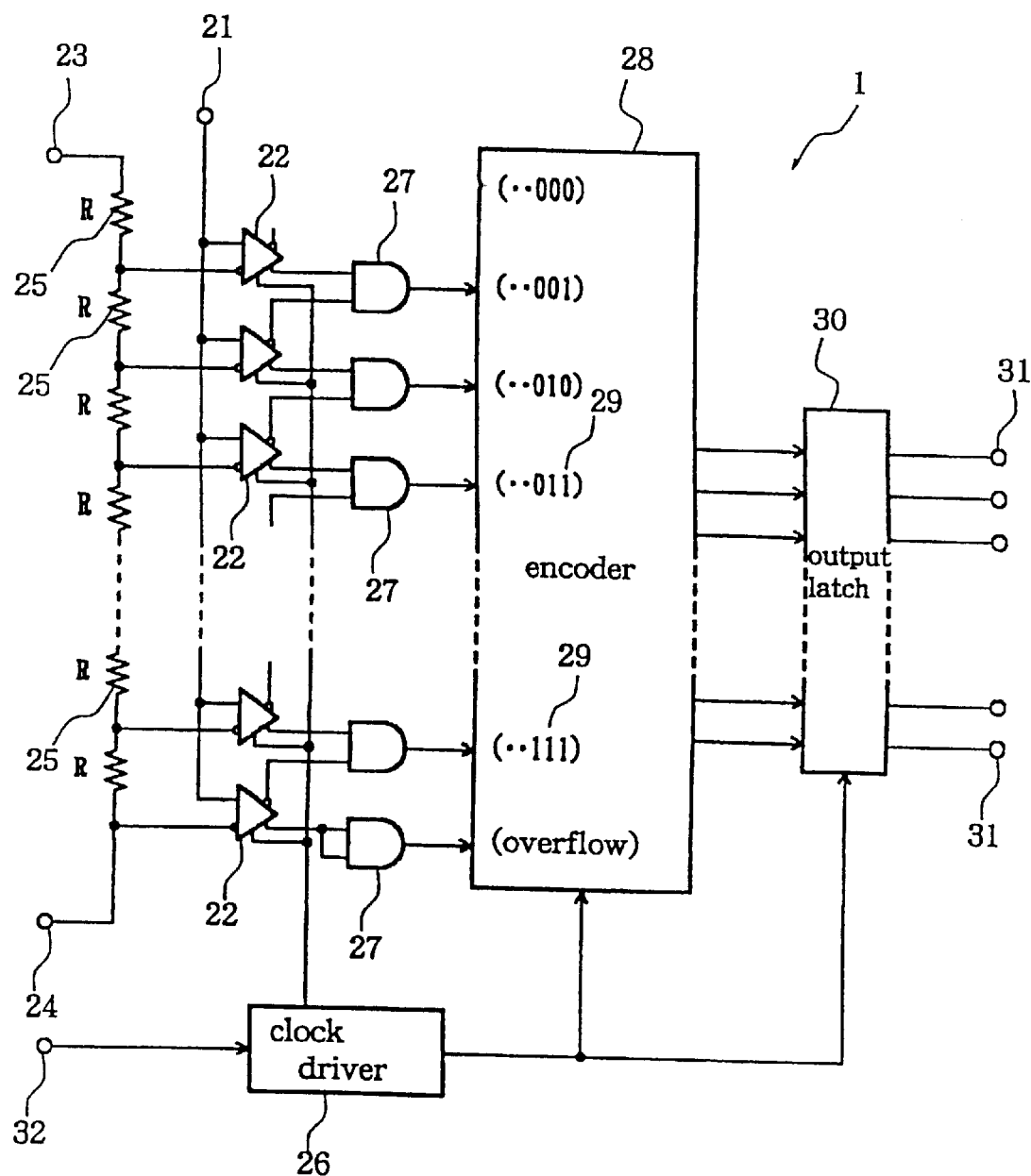
FIG. 1 is a block circuit diagram of an example of a parallel type of A/D converter according to the prior art.

FIG. 1 is the block circuit diagram of an example of a parallel type of A/D converter (1) according to the prior art, which transforms analog signals into two digit binary notation of digital data signals. Analog signals are input to the A/D converter (1) through an analog input terminal (21) as voltage which is changing with time. The changing voltage is supplied in parallel to comparators (22). When reference voltages equal to the minimum and maximum voltages in the range in which the changing voltage is converted to digital data signals are input through respective terminals (23, 24), the reference voltages are divided by two or more resistances (25), and then the divided voltages are supplied to respective comparators (22), to be compared with the analog signals. In accordance with a signal from a clock driver (26), each of all the comparators (22) compare the two respective incoming voltages. When comparison results are output to an encoder (28) through AND circuits (27), numerical values equal to the numbers of the comparators, in which the high or low of the analog signal and divided reference voltages is reversed, are transformed to two digit binary notation of digital data signals to be sent to an output latch (30). FIG. 1 also shows relational numbers (29) between signals input through the AND circuits (27) and digital data signals generated in the encoder (28). When no signals are input through the AND circuits (27), the minimum value or zero is output to the output latch (30).

While analog signals to be input through the analog input terminal (21) are changing every moment, all the comparators (22) are activated at the same moment, the encoder (28) changes the input analog signals into two digit binary notation of digital data signals, to send them to the output latch (30), and the digital data signals which have been momentarily stored in the output latch (30) are output from the digital output terminals (31). The timing of those operations is controlled by the clock driver (26). On the other hand, pulse signals to be issued at constant time intervals, or command signals (not shown) from outside are input to a terminal (32), when the ever-changing analog signals are sampled at the instructed times, changed into digital data signals, and finally output through the digital output terminal (31).

With the parallel type of A/D converter (1) shown in FIG. 1, voltages equal to the boundary values of the variance of numerical values shown by respective digital data signals are previously prepared and supplied in such a way as divided by the plurality of resistances (25). This arrangement functions only to compare high or low voltages of incoming analog signals, so that the time required for changing an analog signal into a digital data signal might be shorter than the case where every one digit or two or more digits are processed successively. However, the more the number of digits of digital data signals, not only more of the resistances (25), comparators (22) and AND circuits (27) are required to express the longer digital data signals, but also analog signals must be supplied to all the comparators (22). Accordingly, the number of digits of digital data signals to be obtained by the parallel type of A/D converter is limited not only by the above-described reasons, but also from a standpoint of the capacity of analog signals.

Figure 2:
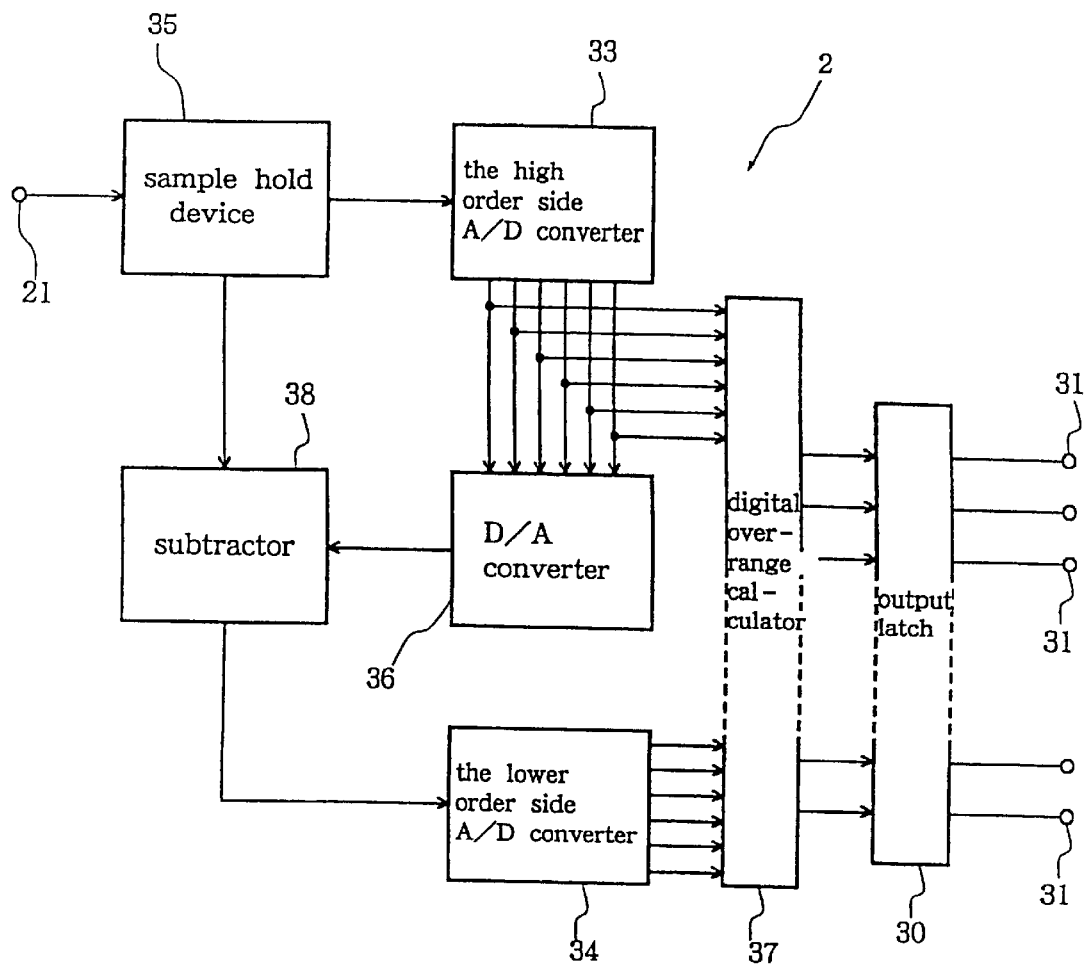
FIG. 2 is a block diagram of an example of a series-parallel type of A/D converter according to the prior art.

FIG. 2 is a block diagram of an example of a series-parallel type of A/D converter (2) according to the prior art, which transforms analog signals into two digit binary notation of digital data signals. This A/D converter (2) has two units (33) and (34) of the parallel type of A/D converter (1) therein. They are not activated at the same time, but with a time difference, so that this type of A/D converter (2) may take more time in conversion than a parallel type of A/D converter which obtains the same number of digits of digital data signals, but is inexpensive. When an analog signal is input from an analog input terminal (21), a clock driver (not shown) instructs a sample hold device (35) to keep the analog signal, thus preventing the incoming analog signal from changing within one sequence of processing. Then, the sample hold device (35) supplies the trapped analog signal to the high order side A/D converter (33). The A/D converter (33) converts the input analog signal into a digital data signal in the similar way of the aforementioned parallel type of A/D converter (1), and sends the obtained digit data signal to a D/A converter (36) and a digital over-range calculator (37). Receiving the digital data signal, the D/A converter (36) outputs a voltage equivalent to the signal to a subtractor (38).

The subtractor (38) subtracts the voltage (as a digital data signal) sent from the D/A converter (36) from the voltage (as an analog signal) sent from the sample hold device (35), and supplies the differential voltage to a lower order side A/D converter (34). The differential voltage may sometimes be amplified in accordance with the characteristics of the lower order side A/D converter (34).

With the series-parallel type of A/D converter (2), normally, the range of analog signals to be transformed into digital data signals by the lower order side A/D converter (34) is set wider than that of analog signal equivalent to 1 at the least significant order of the higher order side A/D converter (33), so that, even if the processing of an analog signal equivalent to the least significant digit of the higher order side A/D converter (33) is a little rough, the conversion accuracy of the lower order side A/D converter (34) can be realized, thereby resulting in a low cost and a high accuracy. The range of analog signals which are transformed into digital data signals by the lower order side A/D converter (34) is wider than that of analog signals equivalent to 1 at the least significant order of the higher order side A/D converter (33). Thus, after the digital data signals obtained from the higher order side A/D converter (33) and the lower order side A/D converter (34) are corrected by the digital over-range calculator (37), the corrected digital data signals are supplied to the output latch (30). Then the output terminal (31) outputs the digital data signals.

Either one of the above-described A/D converters according to the prior art outputs digital data signals of two digit binary notation using {0, 1} digit set. However, digital data signals to be handled by the A/D and D/A converters according to the invention are the HEN2, or the three digit symmetric binary notation, which is a combination of such signals, selected from a 2-based three digit redundant binary number with either one signal of three digits {n, o, p} each expressing value {−1, 0, 1} as one-digit signal, as at least one of two adjacent digits at any digit position of one or more digits is zero (the signal "o"). Therefore, first of all, detailed description will be made about the HEN2.

FIG. 3(A) is an integer table showing the relation of digit numbers of HEN2 and the decimal integers. FIG. 3(A) shows the range of integers by HEN2 notation (3) when the number of digits is changed, in a form of comparison with the case by decimal notation (10). As shown in FIG. 3(A), with the HEN2, a signal other than zero at the most significant digit (that is, non-zero most significant digit) specifies whether the numerical value is positive or negative. When all digits are "o" indicating zero, the value is zero. When the first order of integer by HEN2 is "o" indicating zero digit, the number is even, while, if a non-zero digit, the number is odd. Therefore, as shown in FIG. 3(A), when the number of digits are even, the maximum value and the minimum value (or negative and maximum absolute value) among the integers expressed by the number of digits are both even, while, when the number of digits are odd, they are both odd.

As shown in FIG. 3(B), integers (41) with N digits consist of a cluster of the integers (43) added by "o" to the Nth digit or head of integers in integer group (42) of (N−1) digit, integers (45) which are made by placing an integer group (44) of (N−2) digit on the maximum value of the cluster of the integers (43) and by adding "po" at the Nth order and the (N−1)th order of respective integers, and integers (46) which are made by placing an integer group of (N−2) digit below the minimum value of the cluster of the integers (43) and by adding "no" at the Nth order and the (N−1)th order of respective integers. When the number of integers smaller than or equal to N digit is assumed K, the relation between N and K is as follows:

(1) When N is even;

$$K = \sum_{j=0}^{N/2} 4^j$$

|  | (cal. by decimal) |  | (HEN2) |
|---|---|---|---|
| When N is 2 | K = 1 + 4 | =5= | pop |
| When N is 4 | K = 1 + 4 + 16 | =21= | popop |
| When N is 6 | K = 1 + 4 + 16 + 64 | =85= | popopop |

(2) When N is odd;

$$K = 4^{(N+1)/2} - \sum_{j=0}^{(N-1)/2} 4^j$$

|  | (cal. by decimal) |  | (HEN2) |
|---|---|---|---|
| When N is 1 | K = 4 − 1 | =3= | pon |
| When N is 3 | K = 16 − (1 + 4) | =11= | ponon |
| When N is 5 | K = 64 − (1 + 4 + 16) | =43= | pononon |

Calculation by decimal notation may look complicated. On the other hand, in expressing number of pieces K by HEN2, as described above, assuming that the number of digits of K is (2k+1), and that the (2k+1)th order of integer is "p", when lower even digits are divided two digits by two digits, all of the dividends are buried up by "on" or "op". The inventor found further that, as shown in FIG. 4, this rule or law proved to be very simple when trying to apply this law to signal conversion methods and A/D converters which transform analog signals to digital data signals.

Figure 4:
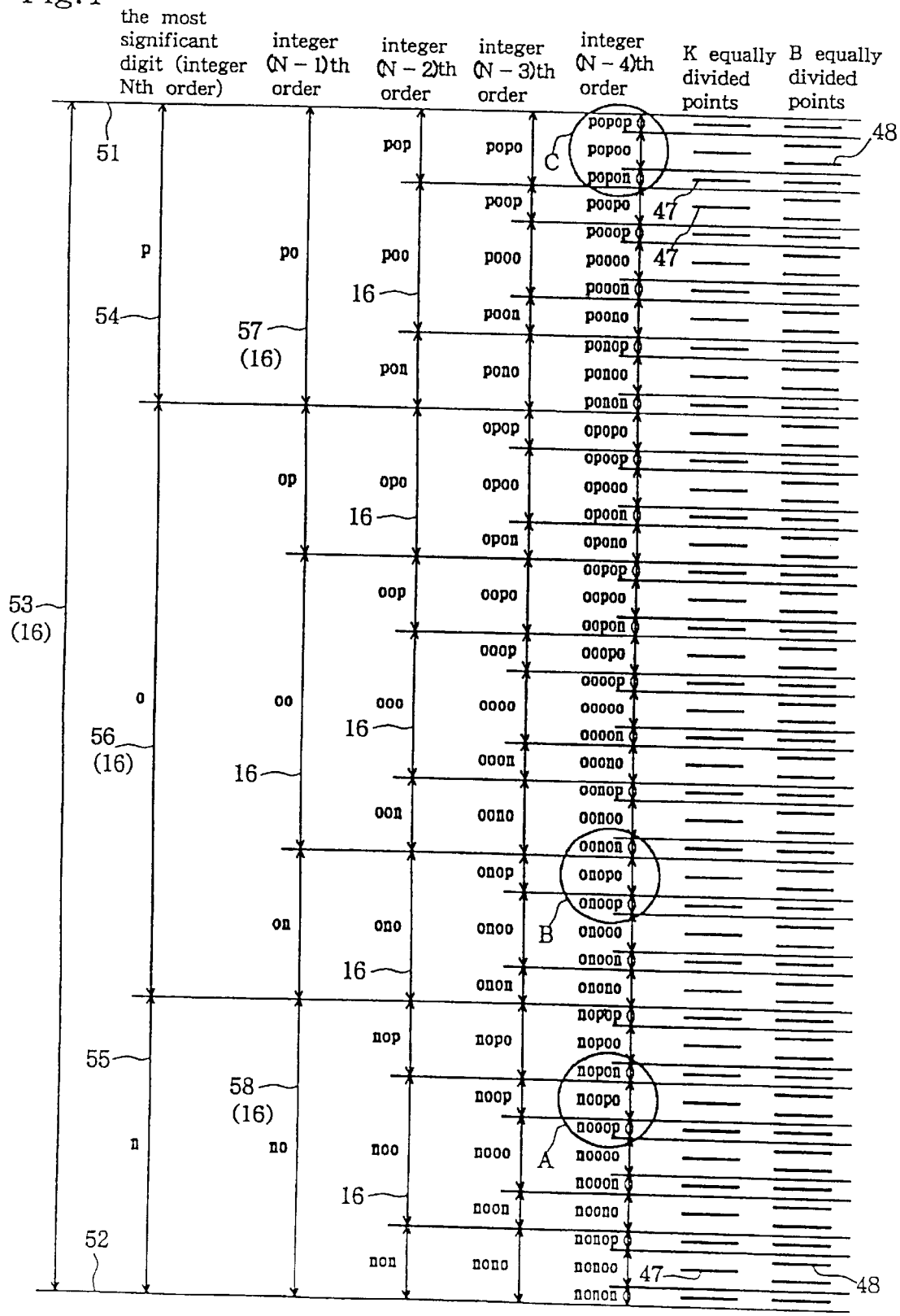
FIG. 4 is an illustration showing the relation of digital data signals at every digit of HEN2 and the range of analog signals corresponding to them.

As shown in FIG. 4, the total range of an analog signal to be transformed into digital data signals, that is, a range between the maximum displacement (51) of the analog signal (equal to the maximum value of an A/D converted digital data signal) and the minimum displacement (52) of the analog signal (equal to the minimum value of the digital data signal), is called the peak-to-peak range (53) of an analog signal to be transformed. First, the peak-to-peak range (53) is treated as a dividing region (16), which is divided into four equal sub-regions. Two quarter sub-regions at the upper and lower ends respectively are given "p" (54) and "n" (55) to a relevant digit of respective digital data signals, while two quarter sub-regions at the intermediate portion respectively are given "o" (56) to a relevant digit of respective digital data signals. In this way, the first digit of digital data signals transformed by the HEN2 notation is determined as "p" (54), "n" (55), or "o" (56). As described previously, HEN2 is a combination of such signals, as at least one of two adjacent digits at any digit position is zero (the signal "o"). The digital data signal notations in the one quarter sub-regions at the upper and lower ends respectively start by non-zero digit, so that the next lower order digit must be "o", that is, like "po" (57) or "no" (58). And, now, let us go to the intermediate two-quarter sub-region (56) with "o" at the top, which is treated as the second dividing region (16) to be divided into four sub-sub-regions to decide the next digits.

As such, since the digits of "p" (54) and "n" (55) are non-zero, the next digit never fails to be "o", thus respectively obtaining "po" (57) and "no" (58). For the intermediate two-quarter sub-region (56) with "o". Anywhere "o" region is treated as the next dividing region (16) which is divided into four sub-regions. The relevant digits of the two upper and lower sub-regions are respectively given "p" (54) and "n" (55), while the relevant digits of the intermediate two-quarter sub-regions are given "o" (56). Repetition of such procedure from higher order digit to lower order digit can decide the total range of an analog signal corresponding to HEN2 of digital data signals having a predetermined number of digits.

With the HEN2, when lower order digits other than a certain digit are truncated to "o" (zero digit), a range expressed by + or − (that is, a range a same distance apart respectively to the positive and negative directions) results in being truncated for centering. Therefore, when respective integer values of digital data signals are pointing to the center of the ranges of the corresponding analog signals, K equally-divided points (47) (K equal to the number of integers by the N digit HEN2) are located in the center of the range of analog signals corresponding to the lowest order digit of the N digit HEN2. FIG. 4 shows 43 equally divided points (47) when N is 5. In determining the range of the least significant order non-zero digit, when the range of "o" at one higher order digit is treated as the dividing region (16) which is equally divided into four sub-regions, respective centers of the four sub-ranges are equivalent to $2^{(N+1)}$ equally divided points (48) (hereinafter referred to "B equally divided points") as shown in FIG. 4. That is, when N is 5, 64 equally divided points. When the least significant digit is non-zero, the B equally divided points come to the center of the range, while, when "o" (indicating zero digit), they come to two points off center of the four equally divided points in the range.

Figure 5:
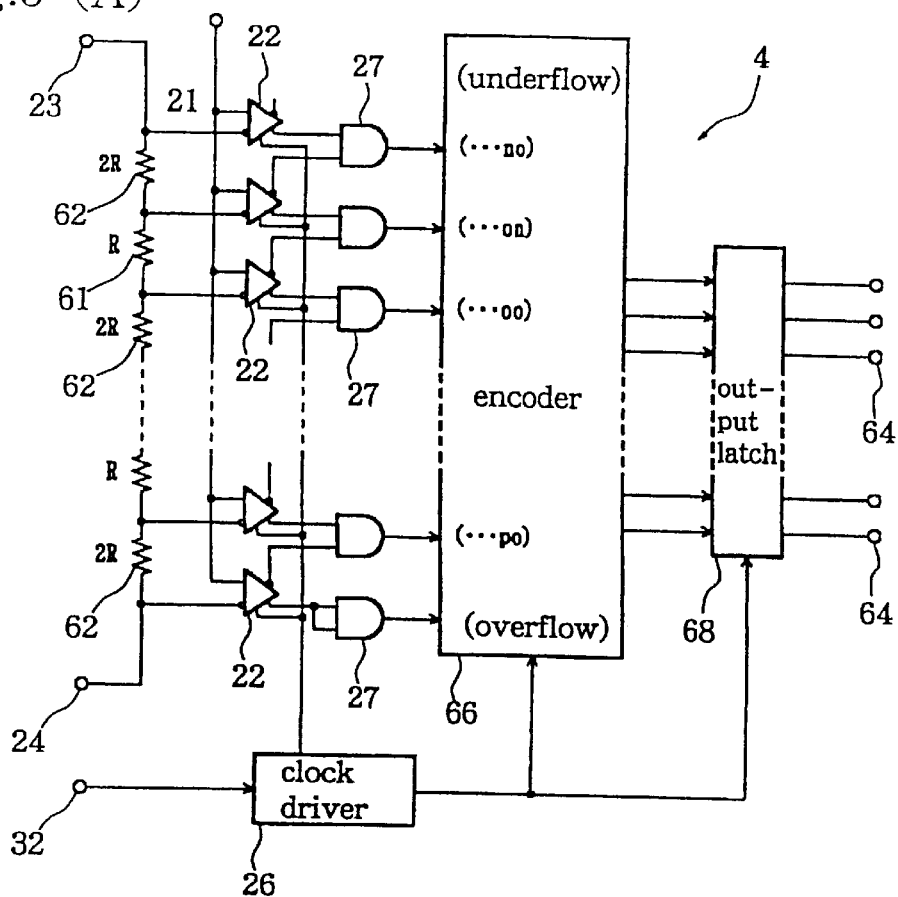
FIG. 5(A) is a block circuit diagram showing a parallel type of A/D converter according to the first embodiment of this invention.
FIGS. 5(B) and 5(C) are illustrations showing the relation of digital data signals as output from the A/D converter and the range of analog signals corresponding to them.
Figure 5:
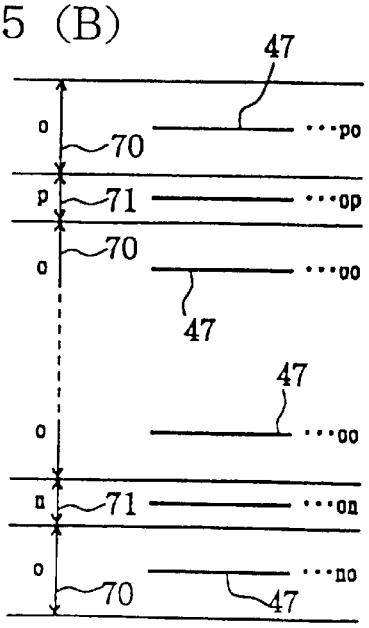
Figure 5:
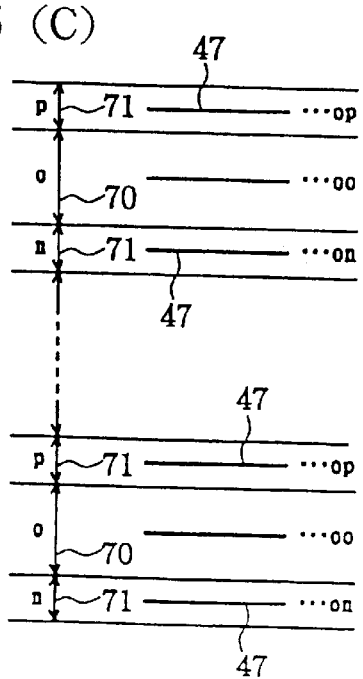

FIG. 5(A) is the block circuit diagram showing a parallel type of A/D converter (4) according to the first embodiment of this invention. Difference between the parallel type of A/D converter (4) and the conventional A/D converter (1) in FIG. 1 is the arrangement of the plurality of resistances (61) and (62) in the A/D converter (4) to divide the reference voltage, and that outputs from the encoder (66), output latch (68) and output terminal (64) also are HEN2 (3) of three digit digital data signals. As shown in FIG. 3, whether the least significant digits of the maximum integer and the minimum integer (that is, negative with maximum absolute value) are zero or non-zero depends upon whether the number of digits is even or odd. This is shown in FIGS. 5(B) and 5(C).

When the number of digits is even, as shown in FIG. 5(B), the upper and lower ends are zero digits (70), while the intermediate is an alternating series of non-zero digit (71) and zero digit (70). Therefore, as shown in FIG. 5(A), at both ends are placed the resistances 2R (62) (equal to twice that of R (61)), while at the intermediate portion the R (61) and the 2R (62) are arranged alternatingly. In other words, the widths of non-zero digit (71) and zero digit (70) are in one to two relation, so that the widths of analog signals must be so. Therefore, the plurality of resistance values to divide reference voltage is also given at a ratio of one to two.

When the number of digits is odd, as shown in FIG. 5(C), the upper and lower ends are non-zero digits (71), while the intermediate is an alternating series of zero digit (70) and non-zero digit (71). Therefore, in this case, the arrangement of the plurality of resistances must be different from the one shown in FIG. 5(A). That is, R(61) is placed at the upper and lower ends, while 2R (62) and R (61) are placed alternately. In both cases, the positions of analog signals corresponding to obtained digital data signals come to K equally divided points (47), when they are brought to the center of the range assigned to the least significant digit of HEN2.

Using the A/D converter (4) shown in FIG. 5(A), probability of an even number of digital data signals obtained from an analog signal is essentially twice that of an odd number of digital data signals, which is not a natural practice. This is originated from faithful reproduction of HEN2 rules. The A/D converter (4) is the best application when determining lower digits, like the high order side A/D converter (33) in the series-parallel type of A/D converter (2) shown in FIG. 2, but inadvisable when determining the least significant digit. Here, FIG. 6(A) shows the second embodiment of the invention, an A/D converter which has an essentially equal probability of even and odd numbers.

Figure 6:
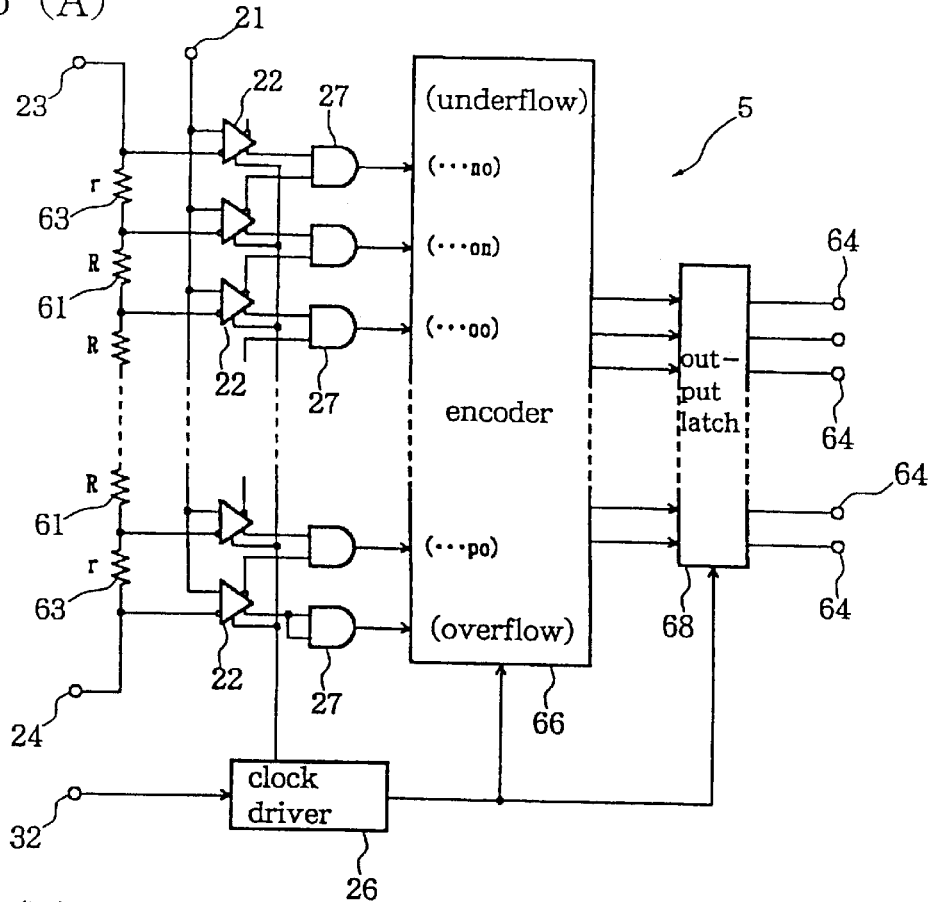
FIGS. 6A–C are block circuits diagram showing a parallel type of A/D converter according to a second embodiment of this invention.
Figure 6:
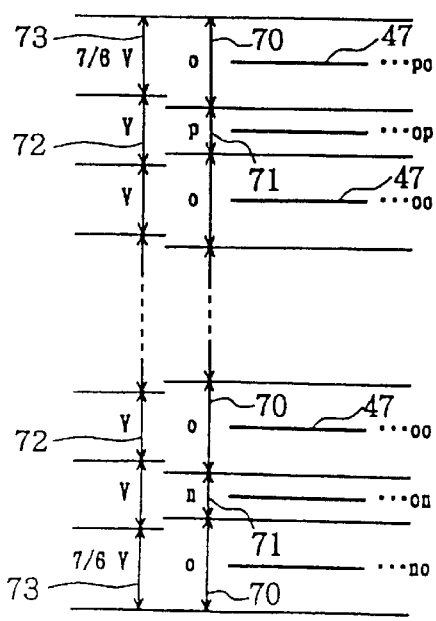
Figure 6:
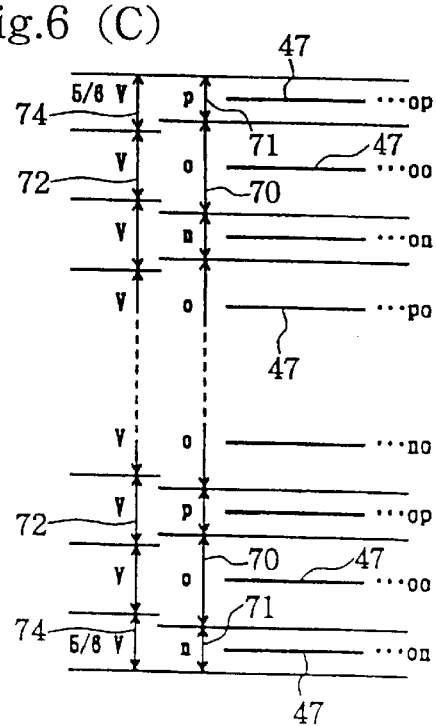

FIG. 6(A) is the block circuit diagram showing the series-parallel type of A/D converter (5) according to the second embodiment of this invention. All of the intermediate resistances (61) which divide the reference voltages (23) and (24) excepting upper and lower end resistances (63) have the same resistance value, so as to equalize the width (72) of the analog signals corresponding to them. When the least significant digit is non-zero (71), the integer is an odd number, while, when zero (70), the integer is even number. To have an essentially equal probability of odd and even numbers, the width (72) of analog signals corresponding to the least significant digit must be same irrespective of odd or even. In other words, when the widths (72) of analog signals assigned to a non-zero digit (71) and a zero digit (70) are equalized, the upper and lower ends of resistances (63) dividing the reference voltage are so adjusted that K equally divided points (47) come to the center of respective analog signals. Here, adjusted are the resistances r shown in FIG. 6(A). (1) When the number of digits is even, as shown in FIG. 6(B), the voltage width (73) at both ends is made 7/6 times the others, that is, r=7R/6. (2) When the number of digits is odd, as shown in FIG. 5(C), the voltage width (74) at both ends is made 5/6 times the others, that is, r=5R/6. In this connection, it goes without saying that, with the embodiment, reference voltages (23) and (24) are not changed, and both ends of resistances (63) are changed to have agreement with K equally divided points (47). However, reference voltages (23) and (24) can be changed to use all of the resistances (61 and 63) as the same that is r=R.

Figure 7:
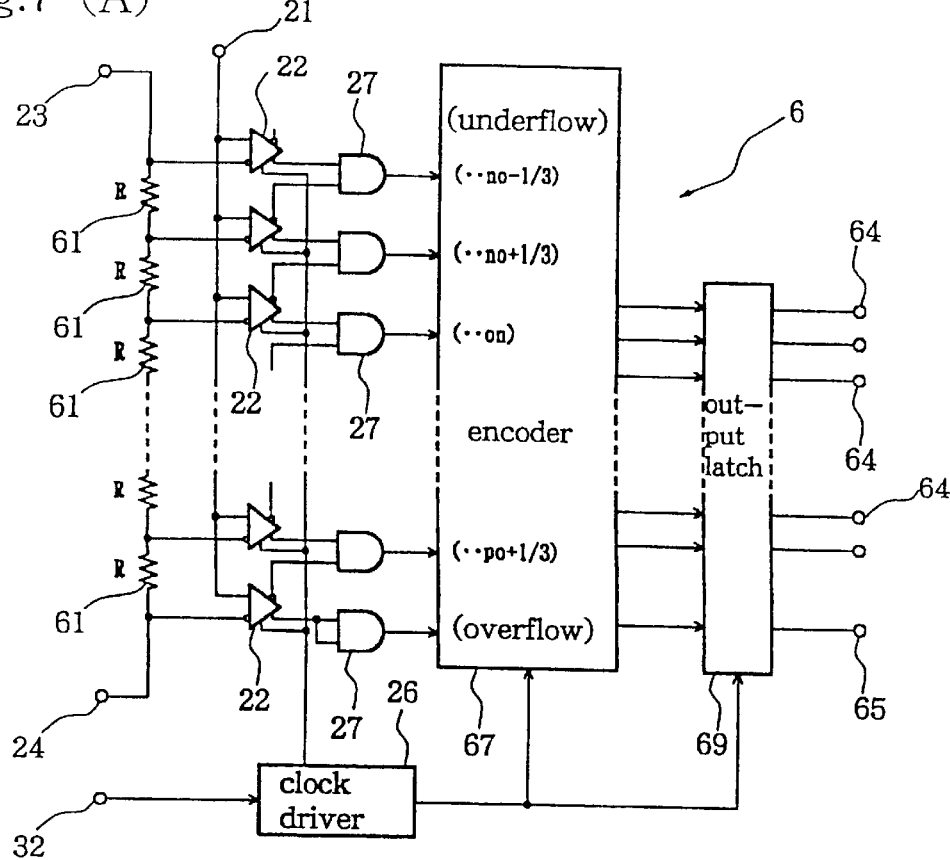
FIG. 7(A) is a block circuit diagram showing a parallel type of A/D converter according to a third embodiment of this invention.
FIGS. 7(B) and 7(C) are illustrations showing the relation of digital data signals as output by the A/D converter and the range of analog signals corresponding to them.
Figure 7:
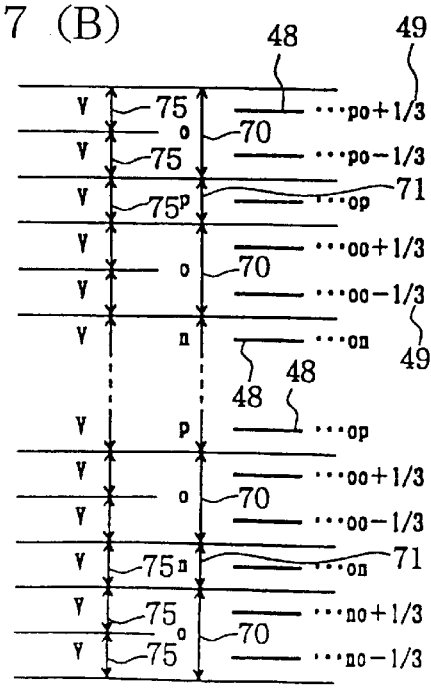
Figure 7:
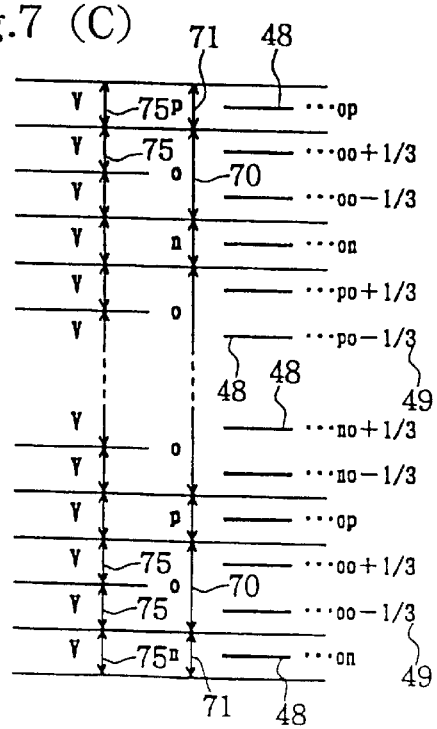

FIG. 7(A) is the block circuit diagram showing the parallel type of A/D converter (6) according to a third embodiment of this invention. This A/D converter (6) is arranged in the same way as the conventional A/D converter (1) as shown in the FIF. (1) block circuit diagram. All of the plurality of resistances dividing the reference voltages (23) and (24) take same values (61). As shown in FIG. 7(A), when an N digit of HEN2 is applied, $2^{(N+1)}$ pieces of resistance are used, to equalize the widths of analog signals. FIG. 7(B) shows the case when N is even, while FIG. 7(C) shows the case when N is odd. And, when the least significant digit is non-zero (71), the digital data signals come to the center of the sub-ranges. When zero (70), the digital data signals come to two points excepting the center of quarter points with twice the width of non-zero digits. Therefore, the value equivalent to the position is not an integer but (the integer + or −⅓ (fraction) (49)), that is, equivalent to the B equally divided points (48) in FIG. 4. The encoder (67) and the output latch (69) in this A/D converter (6) have not only the output terminal (64) outputting HEN2 (3), but also another output terminal (65) outputting signals for the + or −⅓ (fraction) (49). Additionally to the output signals {n, o, p} of every digit of HEN2 (3) output from the output terminal (64), three digit signals (either one of {n, o, p}) is also output from the output terminal (65).

Figure 8:
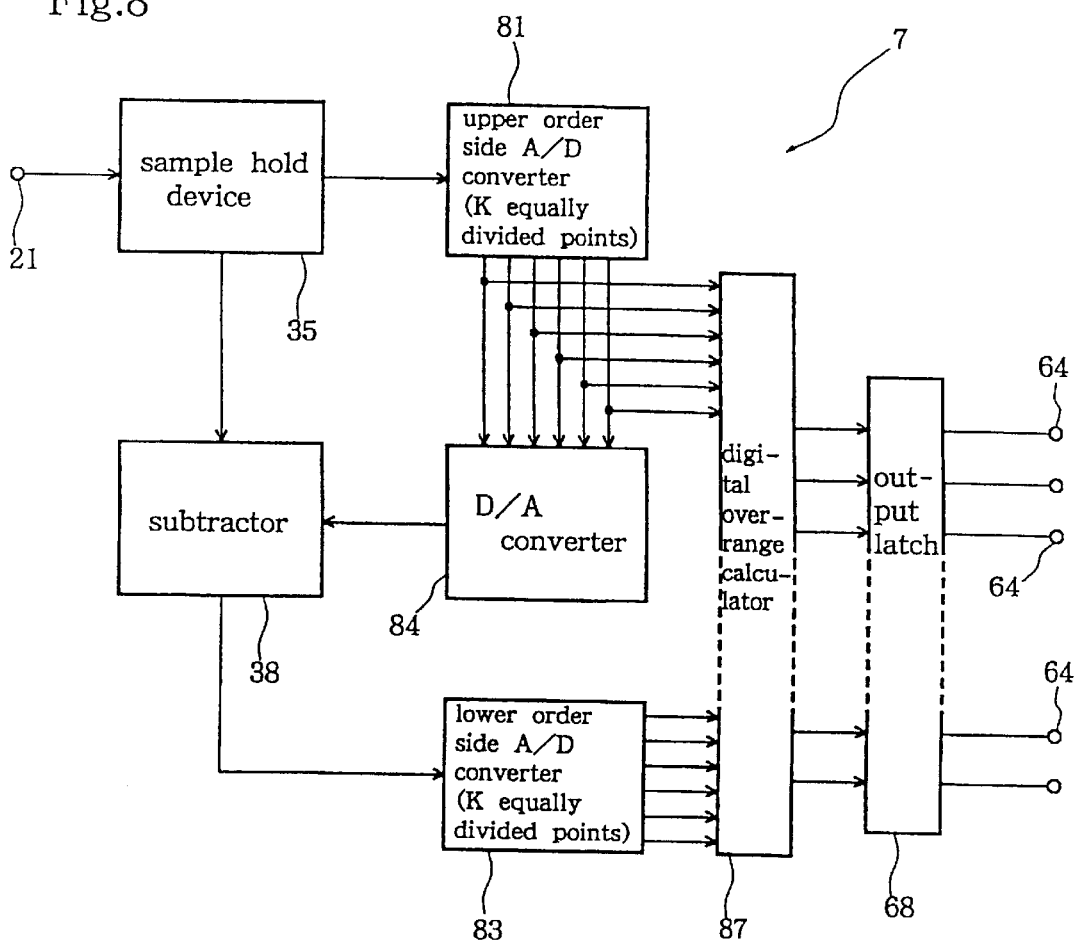
FIG. 8 is a block diagram showing a series-parallel type of A/D converter according to a fourth embodiment of this invention.

FIG. 8 is the block diagram showing the series-parallel type of A/D converter (7) according to the fourth embodiment of this invention. The A/D converter (7) includes an upper order side A/D converter (81), a lower order side A/D converter (83), and a D/A converter (84). In FIG. 8, the A/D converter (4) according to the first embodiment is used for the upper order side A/D converter (81), the A/D converter (5) according to the second embodiment is used for the lower order side A/D converter (83), and a D/A converter (11) according to the sixth embodiment (to be described later) is used for the D/A converter (84). Here, if the lower order side A/D converter (83) should select the range of analog signals to be transformed to digital data signals to that of the least significant zero digit (70) of the upper order side A/D converter (81), when the least significant digit of the upper order side A/D converter (81) happens to be non-zero (71), adjacent sub-ranges may overlap with each other, because the range to be converted by the lower order side A/D converter (83) covers twice that of the least significant non-zero digit to be converted by the upper side A/D converter (81).

Figure 9:
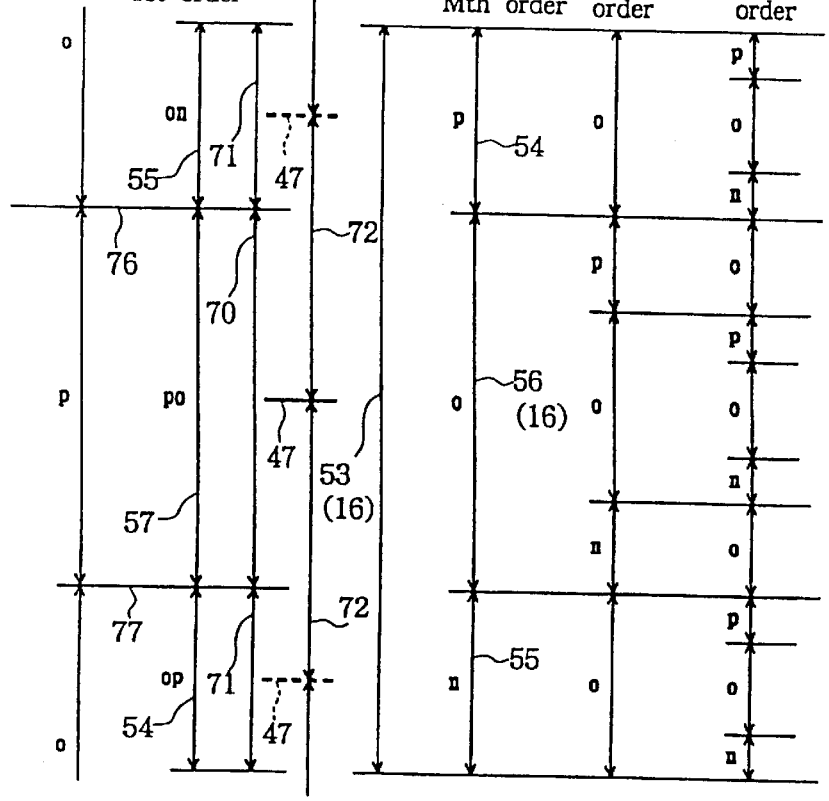
FIG. 9(A) is a partially enlarged illustration showing the relation of the range of analog signals.
FIGS. 9(B) to 9(J) illustrate the calculation procedure of a digital over-range calculator for the series-parallel type of A/D converter according to the fourth embodiment.

For more detailed explanation of the above condition, FIG. 9(A) is an enlargement of encircled partial portions (A) and (B) in FIG. 4. As described in FIG. 2, like the conventional A/D converter (2), with series-parallel type of A/D converters, the range of analog signals to be transformed to digital data signals by the lower order side A/D converter (34) is normally set wider than that of analog signals corresponding to the least significant order of 1 of the higher order side A/D converter (33), so as to apply the conversion accuracy of the lower order side A/D converter (34), even if the conversion process of analog signals equivalent to the least significant digit of the higher order side A/D converter (33) should be somewhat rough. Further, with the A/D converter (7) according to the invention shown in FIG. 8, the width of analog signals corresponding to the least significant digit of the upper order side A/D converter (81) depends on the digit value, zero (70) or non-zero (71). Therefore, FIG. 9(A0 shows a case where "po" (57) is further divided by the lower order side A/D converter (83), as a representation of zero-digit (70) when analog signals are wide.

When the two least significant digits of digital data signals converted by the upper order side A/D converter (81) are "po" (57), let us assume that the region (53) (which is treated as a dividing region (16) to be divided into four equal sub-regions) for analog signals to be converted to digital data signals by the lower order side A/D converter (83) is twice that of "po" (57). In short, even if the boundaries (76) and (77) of "on" and "po" as well as "po" and "op" of the two least significant digits obtained by the upper order side A/D converter (81) should be somewhat rough, when they are adequately modified by the output of the lower order side A/D converter (83), the accuracy of the lower order side A/D converter (83) can be applied, thereby resulting in more digits and higher accuracy of HEN2 digital data signals as a whole, using A/D converter (7).

With the series-parallel type of A/D converter (7), the lower order side A/D converter (83) converts the range of analog signals equal to the whole portion of the least significant zero digit (57) converted by the higher order side A/D converter (81) and non-zero digits (54, 55) at both sides, as the region of analog signals to be transformed into digital data signals, thus obtaining M digits of digital data signals by HEN2 notation. Then, a digital over-range calculator (87) adjusts the digit position of the outputs of the higher order and lower order sides of A/D converters (81) and (83) for addition, to obtain the final digital data signals of HEN2 to be output from the A/D converter (7).

When the least significant three digits obtained by the higher order side A/D converter (81) are "opo" (201), and the Mth order of the most significant integer obtained by the lower order side A/D converter (83) is "o" (202), both signals are added to obtain a sum (203) as shown in FIG. 9(B), which becomes the output of the A/D converter (7).

When the least significant three digits obtained by the higher order side A/D converter (81) are "opo" (201), and the most significant two digits obtained by the lower order side A/D converter (83) are "po" (221), both signals are added to obtain a sum (222) as shown in FIG. 9(C). In this case, since two non-zero digits are adjacent each other such signal combinations are reformed or "normalized" to HEN2 notation (223), which is a combination of such signals "o" so that at least one of two adjacent digits at any digit position of one or more digits is zero. Thus modifying the digits including least significant orders of the output of the higher order side A/D converter, results in the output of the A/D converter (7).

When the least significant three digits obtained by the higher order side A/D converter (81) are "opo" (201), and the most significant two digits obtained by the lower order side A/D converter (83) are "no" (226), both signals are added to obtain a sum (227) as shown in FIG. 9(D). In this case also, since two non-zero digits continue or are adjacent each other, such signal combinations are reformed or "normalized" to HEN2 notation (228). Thus modifying the digits including least significant orders of the output of the higher order side A/D converter, results in the output of the A/D converter (7).

Here, FIGS. 9(E) to 9(J) show several cases where (1) the least significant two digits obtained by the higher order side A/D converter (81) are not "po". In other words, the two digits are once regarded as in the outside of both side boundaries (76) and (77) of "po" (57). Nevertheless, (2) accurate conversion by the lower order side A/D converter (83) brings about reconsideration that the least significant two digits obtained by the higher order side A/D converter (81) are sure to be within the range of "po" (57).

Here, FIGS. 9(E) and 9(F) show two cases where the least significant two digits obtained by the higher order side A/D converter (81) are "on" (55), and the most significant two digits obtained by the lower order side A/D converter (83) are "on" (232). In these cases, possible carry digits may affect the higher order digits. Therefore, in either case, sum (233 and 238) is calculated and normalized, to obtain HEN2 (234 and 239), thereby enabling the modification of the digits including the least significant digits of the output obtained by the higher order side A/D converter (81).

FIGS. 9(G) and 9(H) show two cases where the least significant two digits obtained by the higher order side A/D converter (81) are "on" (55), and the most significant two digits obtained by the lower order side A/D converter are "no" (242). In these cases, possible carry digits may affect the higher order digits. Therefore, in either case, sum (243 and 248) is calculated and normalized, to obtain HEN2 (244 and 249), thereby enabling the modification of the digits including the least significant digits of the output obtained by the higher order side A/D converter (81).

FIGS. 9(I) and 9(J) show two cases where the least significant two digits obtained by the higher order side A/D converter (81) are "op" (251), and the most significant two or three digits obtained by the lower order side A/D converter are "po" (252) or "opo" (257). In these cases also, possible carry digits may affect the higher order digits. Therefore, in either case, sum (253 and 258) is calculated and, if necessary, normalized, to obtain HEN2 (253 and 259), thereby enabling the modification of the digits including the least significant digits of the output obtained by the higher order side A/D converter (81).

As shown in FIG. 9(A) and in the exemplified calculations in FIGS. 9(B) to 9(J), generally speaking, the region (53) of analog signals to be transformed into digital data signals by the lower order side A/D converter (83) is not necessarily as wide as shown in this exemplification. It is sufficed that, the conversion result of the lower order side A/D converter (83) with finer conversion accuracy falls within the range required to determine the boundaries of the least significant non-zero digit (71) and zero digit (70) of the higher order side A/D converter (81). That is, the lower order side A/D converter (83) with finer conversion accuracy can cover the allowable limit for the roughness in the conversion accuracy of the higher order side A/D converter (81).

Figure 10:
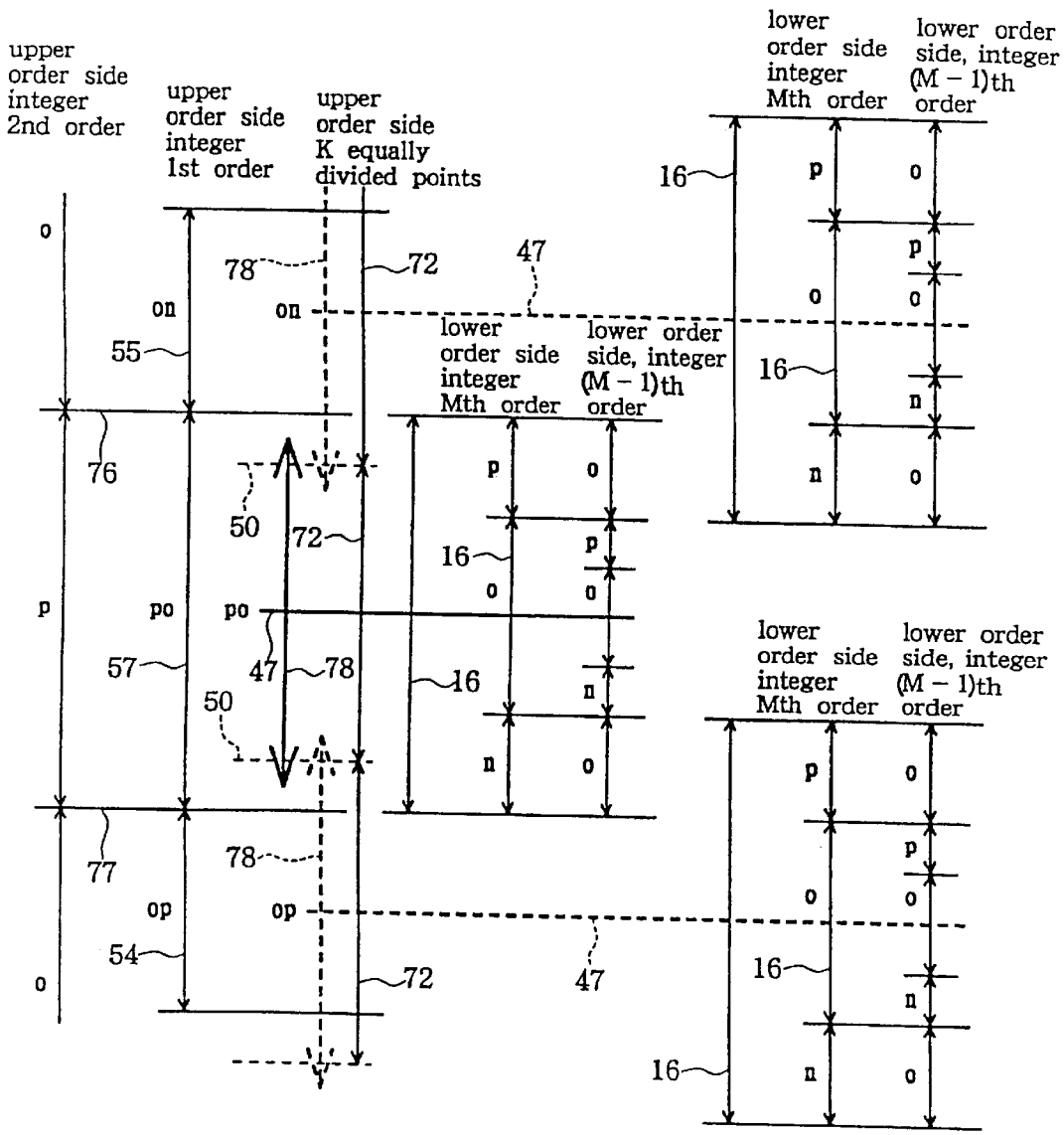
FIG. 10 is a partially enlarged illustration showing the relation of the range of analog signals which are converted into digital data signals by the lower order side of an A/D converter of the series-parallel type of A/D converter according to the fourth embodiment.

FIG. 10 shows an investigation result example for the case where the A/D converter (5) according to the second embodiment is used for the higher order side A/D converter (81), and, irrespective of zero or non-zero of the least significant digit of the higher order side A/D converter (81), K equally divided points (47) are so centered that both sides fall into an analog signal range (72) with a same width. Intermediate points (50) are set for the K equally divided points (47), so that the output of the higher order side A/D converter (81) points the values of the K equally divided points (47) as the representative value of the equally-spaced width (72) between the intermediate points (50) and (50). Further, the range of analog signals to be converted by the lower order side A/D converter (83) is set to a somewhat wider range (78) than that of both side intermediate points (50). But in this case, as shown in FIG. 10, a divided range (16) of the analog signals to be transformed to the most significant order (integer Mth order) of digital data signals by the lower order side A/D converter (83) becomes equal to the width of analog signals equivalent to the least significant zero digit of the higher order side A/D converter, thereby resulting in the same "po" (57) as theoretically expected.

In the case where the A/D converter (5) according to the second embodiment is used for the lower order side A/D converter (83) in this embodiment, the K equally divided points to be obtained as output are not required for covering the whole of range (16) to be divided. As shown in the example of FIG. 10, it goes without saying that a narrower range can be adopted. The width as compared to the equally-spaced width (72) of the higher order side A/D converter (81) is the region (53) of analog signals to be transformed to digital data signals by the lower side A/D converter (83). That is, the range is somewhat wider (78) than that of the side intermediate points (50), which indicates that the allowable limit of the roughness of the higher order side A/D converter (81) is allowed. In other words, the processing range of analog signals to be transformed into digital data signals by the lower order side A/D converter (83) can be determined in accordance with the roughness allowable to the higher order side A/D converter (81).

Figure 11:
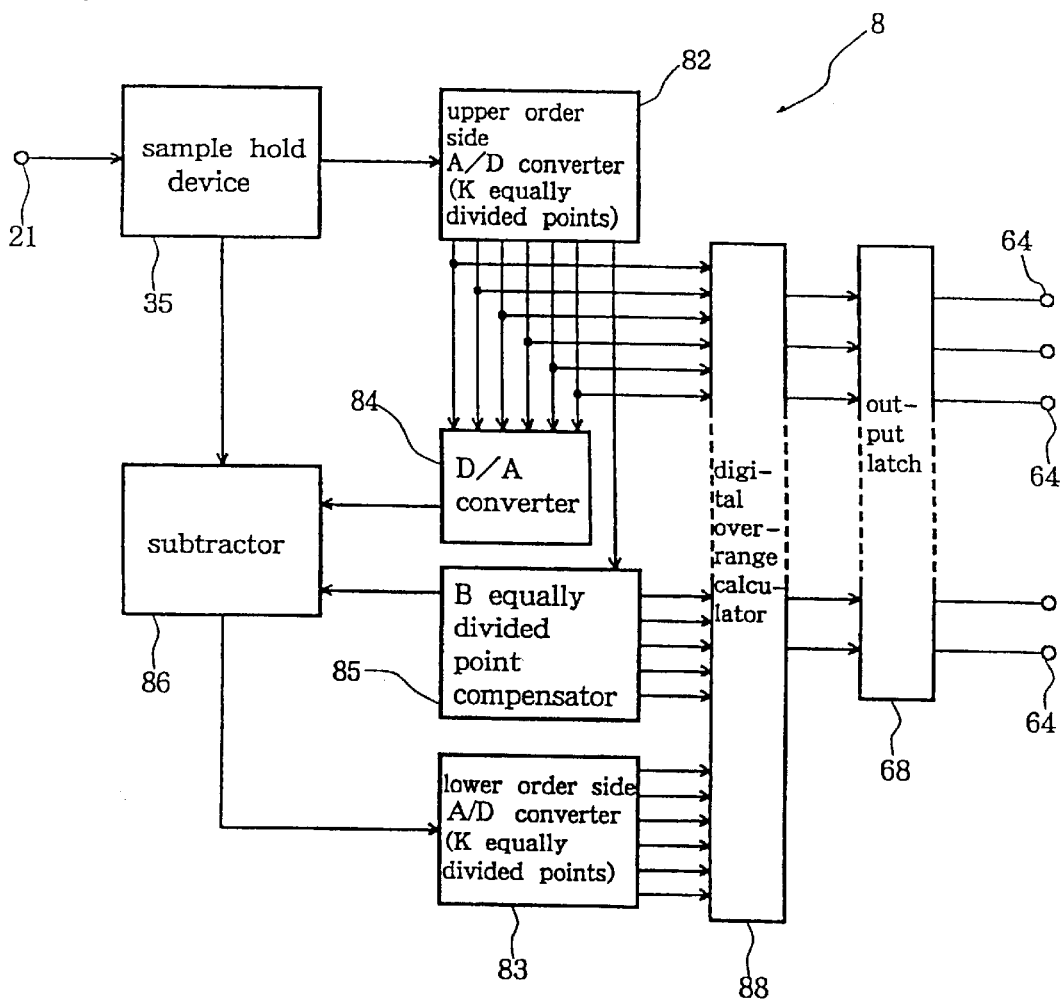
FIG. 11 is a block diagram showing the series-parallel type of A/D converter according to a fifth embodiment of this invention.

FIG. 11 is a block diagram showing the series-parallel type of A/D converter (8) according to the fifth embodiment of this invention. The A/D converter (6) according to the third embodiment is used for this higher order side A/D converter (82), while the A/D converter (5) according to the second embodiment is used for this lower order side A/D converter (83). A D/A converter (11) according to the sixth embodiment (to be described later) is used for the D/A converter (84).

Different from the series-parallel type of A/D converters shown in FIGS. (2) and (8), the A/D converter (8) according to the fifth embodiment houses a B equally divided point compensator (85) therein. This B equally divided point compensator (85) receives a signal from the + or −⅓ output terminal (65) of the higher order side A/D converter (82) in FIG. 7(A), to output analog signals and digital data signals for the compensation of + or −⅓. The analog signals from the B equally divided point compensator (85) are sent to the subtracter (86). The subtracter (86) calculates {analog signal from sample hold device (35)−(analog signal from D/A converter (84)+analog signal from B equally divided point compensator (85))} to send the resultant signal to the lower order side A/D converter (83). On the other hand, digital data signals from the B equally divided point compensator (85) are sent to a digital over-range calculator (88). Receiving digital data signals from the B equally divided point compensator (85) and the higher and lower order side A/D converters (82) (83), the digital over-range calculator (88) outputs the overall digital data signals of the A/D converter (8) from the digital output terminals (64) through the output latch (68).

Figure 12:
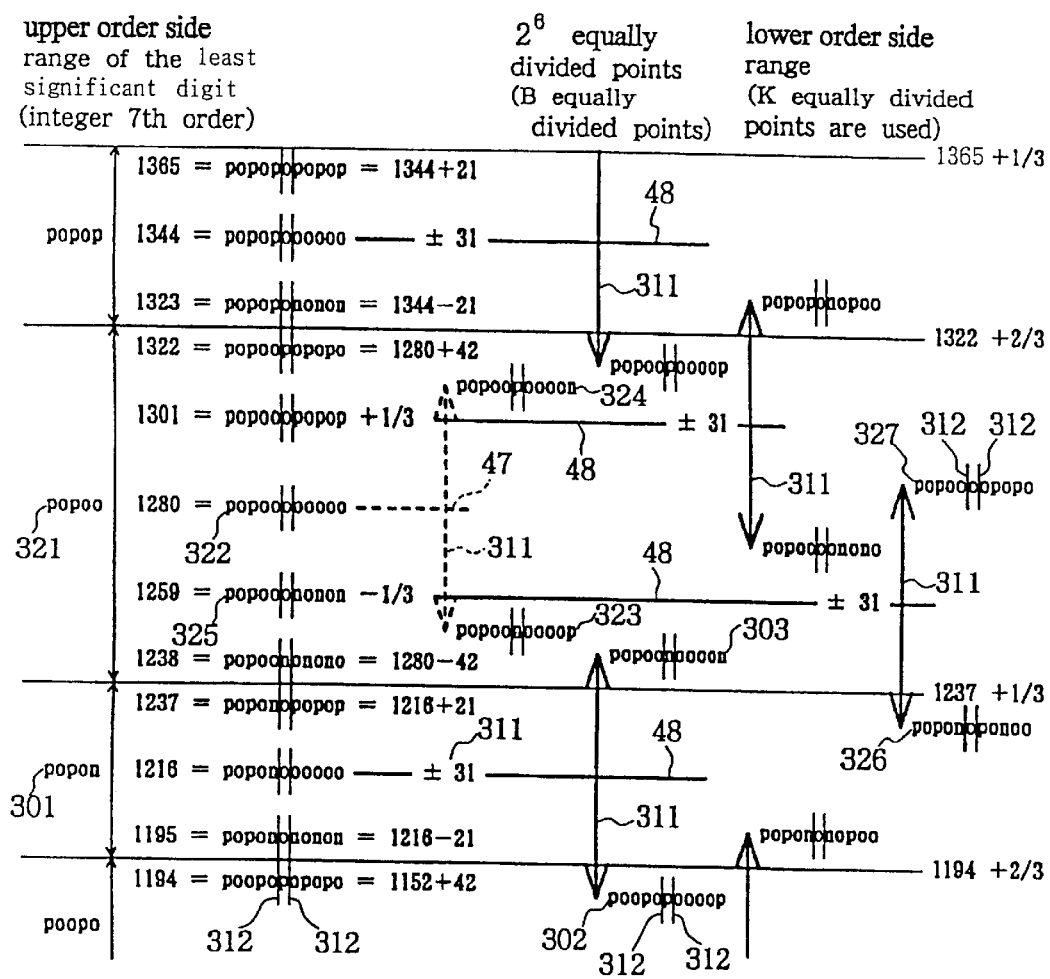
FIG. 12 is an illustration showing the digital over-range of the series-parallel type of A/D converter according to the fifth embodiment, and a partially enlarged illustration showing the relation between digital data signals outputted by the A/D converter and the range of analog signals corresponding to the digital data signals.

FIG. 12 is an illustration showing the digital over-range of the series-parallel type of A/D converter (8) according to the fifth embodiment. More particularly, shown in FIG. 12 are analog signals input to the A/D converter (8), digital data signals to be output from the higher and lower order side A/D converters (82) (83) and the B equally divided point compensator (85), and overall digital data signals output from the A/D converter (8), in which respective exemplified numerical values are written. FIG. 12 is a partially enlarged illustration for the portion (C) in FIG. 4. The higher order side A/D converter (82) uses the A/D converter (6) according to the third embodiment of the invention, which can obtain an output equivalent to the B equally divided point, when (N+1) power of 2=64 (that is N=5). The lower order side A/D converter (83) uses the A/D converter (5) according to the second embodiment, in which 64 divisions equivalent to 6 bits can be made. Here, assuming 5<N<6, 63 divisions (K equally divided points) are used.

As shown in FIG. 12, digital data signals output from the A/D converter (8) consist of 5 digit HEN2 obtained from the higher order side A/D converter (82), 5 digit HEN2 obtained from the lower order side A/D converter (83), and 1 digit HEN2 (obtained from the B equally divided point compensator (85) inserted between the two 5 digit HEN2), thus resulting in 11 digit HEN2. More detailed description is as follows. As described above, the lower order side A/D converter (83) outputs digital data signals corresponding to K 63 equally divided points. Thus the range is + or −31 by decimal notation or "noooop"~"poooon" by HEN2(3). Five digits in this range are completely covered by HEN2, but less than 6 digits. Further, as described above, the higher order side A/D converter (82) covers B equally divided points (N=5), thus outputting 5 digits of HEN2 and fraction of + or −⅓. Combination of both fractions may cover one digit or so. Now, more detailed description is made using numerical values in FIG. 12. For clarification, HEN2 here are added with vertical lines (312) at the boundaries of these digits.

When the output of the higher order side A/D converter (82) is "popon" (301), the lower order side A/D converter (83) outputs the values in the range of + or −31 (311), so that, as a whole, the A/D converter (8) outputs "poopopoooop" (302)−"popoonoooon" (303).

When the output of the higher order side A/D converter (82) is "popoo" (321), if a value "popooooooo" (322) should be selected as the central value in the range and the output of + or −31 of the lower order side A/D converter (83)

be added thereto, the total becomes "popoonoooop" (323) ~"popoopooon" (324), so that clearance takes place between the aforementioned value. In the case of the A/D converter (8), the higher order side A/D converter (82) outputs not only digital data signals of HEN2 notation as main integer data, but also fractional + or −⅓ from its output terminal (65), so that this fractional signal is used to compensate the clearance by way of the B equally divided point compensator (85). In short, digital data signals "popoo" (321) of HEN2 are delivered to the D/A converter (84) from the higher order side A/D converter (82). Receiving the digital data signals, the D/A converter (84) outputs voltages equivalent thereto. Additionally, the + or −⅓ output terminal (65) of the higher order side A/D converter (82) outputs one digit HEN2 "n" to the B equally divided point compensator (85). Receiving the HEN2 "n", the B equally divided point compensator (85) outputs a voltage equivalent to digital data signal "nonon" to be output by the lower order side A/D converter (83). Since the sum of voltages received from the D/A converter (84) and the B equally divided point compensator (85) are equivalent to an analog signal to be transformed to a digital data signal "popooononon" (325) as an overall output of the A/D converter (8), the subtracter (86) sends the differential voltage between the voltage and the analog signal received from the sample hold device (35), so that the lower order side A/D converter (83) outputs digital data signals of HEN2 in the range of + or −31 (311).

After receiving the output "popoo" (321) of the higher order side A/D converter (82), the output "nonon" of the B equally divided point compensator (85) and the outputs "noooop"~"poooon" of the lower order side A/D converter (83), the digital over-range calculator (88) outputs "poponoponoo" (326)~"popoooopopo" (327) as the overall outputs of the A/D converter (8). This range coincides in a partial range of "poponoponoo" (326)~"popoonooon" (303) with a range output when the output of the higher order side A/D converter (82) is "popon" (301).

This output range of the lower order side A/D converter (83) is taken + or −31 (311). In this connection, with this example, an output range of + or −22 may cause overlapping with an adjacent portion. However, this output range of + or −31 ensures the applicability of the accuracy of the lower order side A/D converter (83), even if the B equally divided points of the higher order side A/D converter (82) are somewhat rough. Therefore, an output range narrower than + or −31 would require higher accuracy for the higher order side A/D converter (82). Further, (1) when the least significant digit is non-zero, B equally divided points come to the center of the non-zero digits, thus resulting in a fractional output of "o". (2) When the least significant digit is zero, "p" or "n" is output instead of "o" expressing the fraction of + or −⅓. With the HEN2 notation, the fraction of + or −⅓ cannot be an integer even with more digits of output of the lower order side A/D converter (83). In other words, in the case of FIG. 12, when HEN2 are replaced by decimal numbers (10), the least significant digit of the output of the higher order side A/D converter (82) would divide the difference 128 of non-zero digits "popon" 1216 and "popop" 1344 equally into three. Therefore, if the compensation voltage of the B equally divided point compensator (85) should be taken as the one equivalent to three equally divided points of the higher order side A/D converter (82), the fraction of + or −⅓ would also be added to the analog signals to be transformed to digital data signals by the lower order side A/D converter (83), thus causing a possibility of poorer accuracy. With this embodiment, since the compensation voltage of the B equally divided point compensator (85) is taken equivalent to analog signals corresponding to integers to be converted into digital data signals, the A/D converter (8) can have a good conversion accuracy. With this embodiment, the higher order side A/D converter (82) has 64 equally divided points equivalent to 6 bits, the lower order side A/D converter (83) has 63 divisions lower than 6 bits, and, as a whole, the A/D converter (8) outputs digital data signals divided into + or −1365=2731 values, equivalent to between 11 bits to 12 bits by the two digit binary notation according to the prior art.

Figure 13:
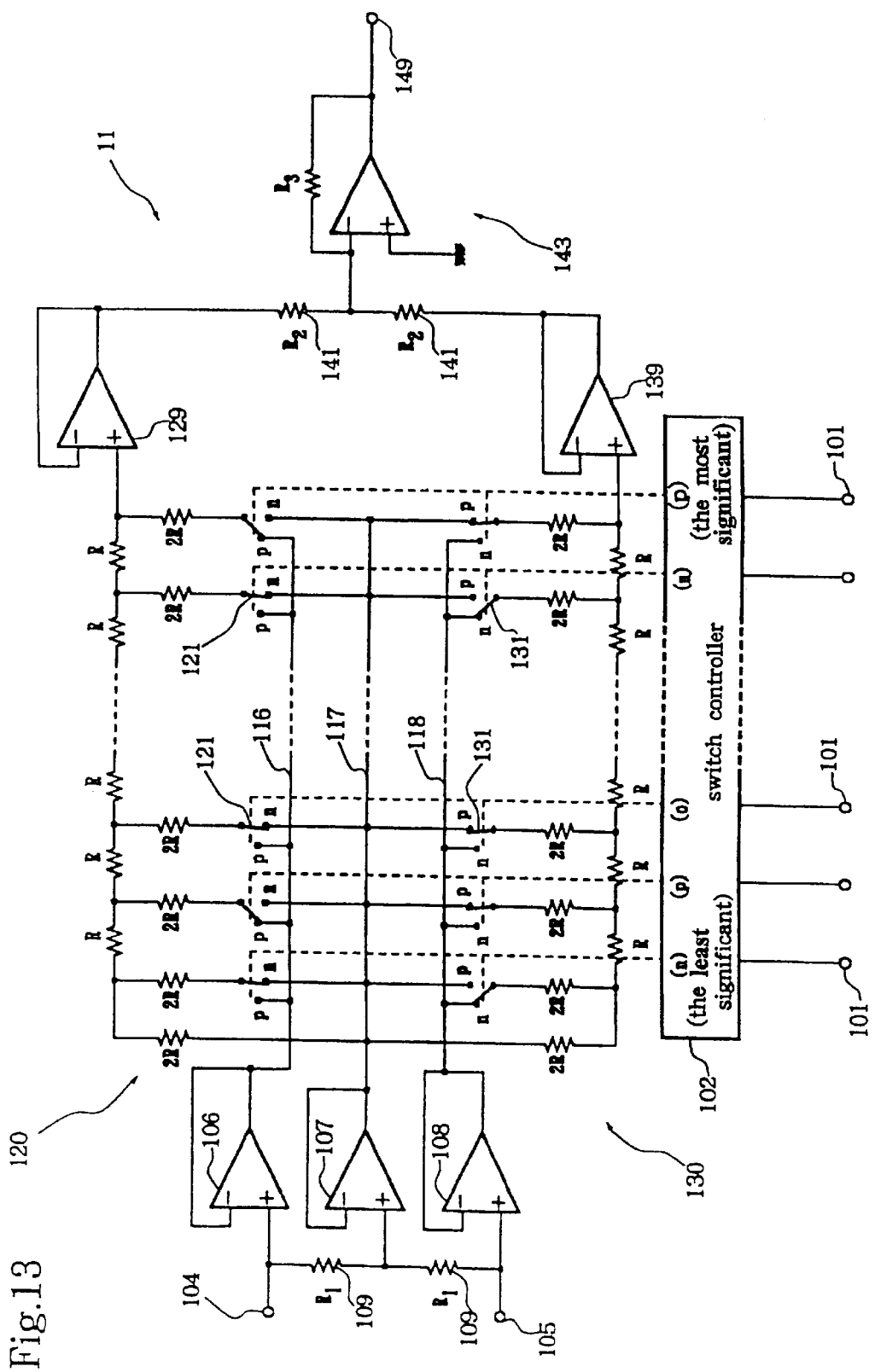
FIG. 13 is a block diagram showing a D/A converter according to a sixth embodiment of this invention.

FIG. 13 is the block diagram showing the D/A converter (11) according to the sixth embodiment of this invention. The D/A converter (11) uses the conventional well-known (R−2R) ladder resistance circuit to output voltages corresponding to input digital data signals as analog signals. The input of digital data signals to be transformed into analog signals is not only limited to HEN2, but here the 2-based three digit binary numbers use one of three digits {n, o, p} as one-digit signals to be processed.

When one or more digits of digital data signals which are one of three digits {n, o, p} at any digit are input from digital input terminals (101), a switch controller (102) activates switches (121) which are built in a p-side (R−2R) ladder resistance circuit (120) and switches (131) which are built in a n-side (R−2R) ladder resistance circuit (130), according to signals at respective digits. One the other hand, reference voltages respectively are supplied to the p-side (R−2R) ladder resistance circuit (120) and the n-side (R−2R) ladder resistance circuit (130). More particularly, when, from a p-side reference voltage input terminal (104) and a n-side reference voltage input terminal (105), different reference voltages are input, the two input voltages are divided into constant voltages Vp, Vo and Vn by two resistances (109) having the same value. The constant voltages Vp, Vo and Vn are supplied to respective reference voltage supply lines (116, 117 and 118) via voltage stabilizers (106, 107 and 108).

The constant voltages Vp and Vo are supplied to the p-side (R−2R) ladder resistance circuit (120). When signals at each digit are "p", switches for respective digits are connected to Vp, while, when signals at each digit are "n", switches for respective digits are connected to Vo. One the other hand, the constant voltages Vn and Vo are supplied to the n-side (R−2R) ladder resistance circuit (130). When signals at each digit are "n", switches (131) for respective digits are connected to Vn. While, when signals at each digit are "p", switches for respective digits are connected to Vo. Further, when signals at each digit are "o", the switches (121) of the relevant digits built in the p-side (R−2R) ladder resistance circuit (120) are connected to Vp, while the switches (131) of the relevant digits built in the n-side (R−2R) ladder resistance circuit (130) are connected to Vn, or both of the switches (121) and (131) are connected to Vo. Which way to take when signals at each digit are "o" may be predetermined or determined considering the overall characteristics of the D/A converter (11) depending on the condition of other switches. In this connection, one same side is not necessarily selected for all digits, but the sides may be different for each digit. In short, it must be observed that outputs of any digit corresponding to "o" signals cancel each other before being output to the analog signal output terminal (149).

Voltages from the p-side (R−2R) ladder resistance circuit (120) and the n-side (R−2R) ladder resistance circuit (130) are stabilized by respective operational amplifiers (129) and (139). The stabilized voltages are respectively supplied to an addition amplifier (143) via respective addition resistances (141) having the same resistance. The amplified sum of voltages is output from the analog signal output terminal (149).

In this connection, with this embodiment, Vo is generated by different voltages (Vp and Vn) respectively supplied from the p-side reference voltage input terminal (104) and the n-side reference voltage input terminal (105). Vp and Vo are supplied to the p-side (R–2R) ladder resistance circuit (120) as reference voltages, while Vn and Vo are supplied to the n-side (R–2R) ladder resistance circuit (130) as reference voltages. But, there may be another method. A same reference voltage (such as Vp and Vo) is supplied to both (R–2R) ladder resistance circuits (120) and (130), and then, the sign of either one of respective output voltages from the (R–2R) ladder resistance circuits (120) and (130) is changed to obtain their sum. Further, the D/A converter (11) may be such circuitry so as to represent output analog signals not as voltage change, but as current change.

The signal conversion method precisely realizes the relation between the digital data signals of HEN2 and analog signals, thereby significantly eliminating useless signal conversions. Thus completely normalized HEN2 is obtained, even if this conversion process is terminated halfway at any digit. The normalized HEN2 takes values rounded off by truncating lower order digits, so that it takes values essentially equivalent to the center of the region of analog signals corresponding to the digital data signals.

According to the signal conversion method, the determined region of analog signals is equally divided into $2^k$ (larger than or equal to 4) pieces of sections. Therefore, using the two digit binary numbers according to the prior art as digital data signals, only the necessary but limited portion of the digital data signals, which must be processed in accordance with this signal conversion method, suffices to be changed to HEN2. Thus simpler and easier processing results.

According to the signal conversion method, the range of analog signals is divided into the number of integers identical to the number of digits assigned to the HEN2 as digital data signals, thereby allowing the predetermined number of digits of HEN2 to be utilized effectively.

With regard to the signal converter, the HEN2 is used as digital data signals, and at least one way or mutual signal conversion is made between the digital data signals and analog signals, thereby resulting in a shorter conversion time and further in direct conversion to be processed between analog signals and the digital data signals using the HEN2 notation system.

What is claimed is:

1. A signal conversion method using three digit symmetric binary numbers (HEN2) as digital data signals, the three digit symmetric binary numbers (HEN2) defined by three digits {n, o, p} each expressing a value {−1, 0, 1} as a one-digit signal, and wherein the digit "o" represents zero, the digital data signals comprising a combination of signals in which at least one of two adjacent digits at any digit position of one or more digits of 2-based three digit redundant binary numbers is the digit "o", the method including:
   dividing analog signals into individual sections corresponding to the digital data signals of the three digit symmetric binary numbers (HEN2); and
   converting at least one of the digital data signals and analog signals into the other of the digital data signals and the analog signals or mutual converting between the digital data signals and the analog signals.

2. A signal conversion method using three digit symmetric binary numbers (HEN2) as digital data signals, the three digit symmetric binary numbers (HEN2) defined by three digits {n, o, p} each expressing a value {−1, 0, 1} as a one-digit signal, and wherein the digit "o" represents zero, the digital data signal comprising a combination of signals in which at least one of two adjacent digits at any digit position of one or more digits of 2-based three digit redundant binary numbers is the digit "o", the method including:
   determining a one-digit digital data signal from the three digit symmetric binary numbers (HEN2) by the following steps:
   (a) determining a region for analog signals of an object of conversion;
   (b) dividing the region into four equal sections;
   (c) regarding the respective digits to which the digital data signal is capable of corresponding to as "p" and "n" at each quarter section of both ends, and
   (d) regarding the digits as "o" at the center two quarters;
   determining the analog region of analog signals corresponding to individual values of digital data signals of three digit symmetric binary numbers (HEN2) having a pre-determined number of digits by repetition of the following steps from higher order digits to lower order digits;
   (a) obtaining "po" or "no" by the following, at any digit where the signal of three digit symmetric binary numbers (HEN2) is "p" or "n", which represents a non-zero digit, making the next digit "o"; and
   (b) at any digit where the signal of three digit symmetric binary numbers (HEN2) is "o" after equally dividing the analog region into four sections, making each quarter section of both ends "p" and "n" as the corresponding digits of the digital data signals and making the center two quarters "o";
   and, converting at least one of the digital data signals and analog signals into the other of the digital data signals and the analog signals or mutually converting between the digital data signals and the analog signals.

3. A signal conversion method using three digit symmetric binary numbers (HEN2) as digital data signals, the three digit symmetric binary numbers (HEN2) defined as a combination of signals in which at least one of two adjacent digits at any digit position of one or more digits of 2-based three digit redundant binary numbers with either one signal of three digits {n, o, p} each expressing value {−1, 0, 1} as a one-digit signal being a signal "o" expressing zero; the method comprising the steps of:
   determining an analog signal region of the analog signals of an object of conversion;
   equally dividing the analog signal region into $2^k$, which represents larger than or equal to 4, pieces of sections;
   making corresponding analog signal regions arranged in descending or ascending order with individual values of the digital data signals having a pre-determined number of digits;
   determining a region of analog signals corresponding to individual digital data signals of three digit symmetric binary numbers (HEN2) with a pre-determined number of digits by the following steps:
   (a) assigning one section of the analog signal region when the least significant digit of the digital data signals is "p" or "n", and
   (b) assigning two consecutive sections of the analog signal region when the least significant digit of the digital data signals is "o";
   and, making at least one of the digital data signals and the analog signals into the other of the digital data signals and the analog signals or mutually converting between the digital data signals and the analog signals.

4. A signal conversion method using three digit symmetric binary numbers (HEN2) as digital data signals, the three digit symmetric binary numbers (HEN2) being defined as a combination of signals in which at least one of two adjacent digits at any digit position of one or more digits of 2-based three digit redundant binary numbers with either one signal of three digits (n, o, p} each expressing value {−1, 0, 1} as a one-digit signal being a signal "o" expressing zero; the method including the steps of:

determining K, the number of integers lower than or equal to Nth digits of the three digit symmetric binary number (HEN2), by N, N being the number of digits of the three digit symmetric binary number (HEN2);

making the number K become a three digit symmetric binary number (HEN2) "pon . . . on" with the (N+2)th digit being an odd or "pop . . . op" with the (N+1)th digit being even by the following steps:
(a) making the number K become an odd digit in the notation system of three digit symmetric binary numbers (HEN2);
(b) making the most significant digit of the number K become "p"; and
(c) dividing the remaining lower even digits of the number K by 2 digits and the remaining digits being filled with "on" or "op";

determining a region of analog signals of an object of conversion;

dividing the analog signal region into the number K sections;

making corresponding sections arranged in descending or ascending order of analog signals with each value of the digital data signals lower than or equal to the Nth digit;

determining a region of analog signals corresponding to individual digital data signals of three digit symmetric binary number (HEN2) with a pre-determined number of digits; and converting at least one of the digital data signal and the analog signals into the other of the digital data signals and the analog signals.

5. A signal converter comprising:

an analog terminal to send and receive analog signals to and from exterior devices;

digital terminals to send and receive one or more digits of digital data signals to and from exterior devices; and signal conversion means to transform signals between analog signals and digital data signals, the signal conversion means using three digit symmetric binary numbers (HEN2) as digital data signals, the three digit symmetric binary numbers (HEN2) being defined as a combination of signals in which at least one of two adjacent digits at any digit position of one or more digits of 2-based three digit redundant binary numbers with either one signal of three digits {n, o, p} each expressing value {−1, 0, 1} as a one-digit signal is a signal "o" expressing zero; the conversion means dividing the analog signals into individual sections corresponding to the digital data signals of the three digit symmetric binary numbers (HEN2); and the conversion means making at least one of the digital data signals and the analog signals into the other or mutually converting between the digital data signals and the analog signals.

6. A signal converter comprising:

an analog terminal to send and receive analog signals to and from exterior devices;

digital terminals to send and receive one or more digits of digital data signals to and from exterior devices; and signal conversion means to transform signals between said analog signals and said digital data signals, said signal conversion means using three digit symmetric binary numbers (HEN2) as digital data signals, the three digit symmetric binary numbers (HEN2) being defined as a combination of signals in which at least one of two adjacent digits at any digit position of one or more digits of 2-based three digit redundant binary numbers with either one signal of three digits {n, o, p} each expressing value {−1, 0, 1} as a one-digit signal is a signal "o" expressing zero;

wherein said conversion means determines a one-digit digital data signal of three digit symmetric binary numbers (HEN2) by:
(a) determining a region of the analog signals of an object of conversion; and
(b) dividing said region into four equal sections, regarding the respective digits to which said digital data signals correspond as "p" and "n" at each quarter section of both ends, and regarding said digits as "o" at the center two quarters, wherein said signal conversion means determines the region of analog signals corresponding to individual values of digital data signals of three digit symmetric binary numbers (HEN2) having a pre-determined number of digits by the repetition of the following steps from higher order digits to lower order digits by:
(a) obtaining "po" or "no" by the following, at any digit where the signal of three digit symmetric binary numbers (HEN2) is "p" or "n", which represents a non-zero digit, making the next digit "o"; and
(b) at any digit where the signal of three digit symmetric binary numbers (HEN2) is "o" after equally dividing said analog region into four sections, making each quarter section of both ends "p" and "n" as the corresponding digits of the digital data signals and making the center two quarters "o";

wherein said signal conversion means converts at least one of the digital data signals and the analog signals into the other or mutually converts between the digital data signals and the analog signals.

7. A signal converter comprising:

an analog terminal to send and receive analog signals to and from exterior devices;

digital terminals to send and receive one or more digits of digital data signals to and from exterior devices; and signal conversion means to transform signals between said analog signals and said digital data signals, said signal conversion means using three digit symmetric binary numbers (HEN2) as digital data signals, the three digit symmetric binary numbers (HEN2) being defined as a combination of signals in which at least one of two adjacent digits at any digit position of one or more digits of 2-based three digit redundant binary numbers with either one signal of three digits {n, o, p} each expressing value {−1, 0, 1} as a one-digit signal is a signal "o" expressing zero;

wherein said conversion means determines a region of the analog signals of an object of conversion and equally divides said analog signal region into $2^k$, which means larger than or equal to 4 pieces of sections, wherein said conversion means arranges corresponding said analog signal regions in descending or ascending order with individual values of said digital data signals have a pre-determined number of digits, wherein said conversion means determines a region of analog signals corresponding to individual digital data signals of three digit symmetric binary numbers (HEN2) with a pre-determined number of digits by:
  (a) assigning one section of said analog signal region when the least significant digit of said digital data signals is "p" or "n", and
  (b) assigning two consecutive sections of said analog signal region when the least significant digit of said digital data signals is "o";

wherein said conversion means converts at least between said digital data signals and said analog signals.

8. A signal converter comprising:

an analog terminal to send and receive analog signals to and from exterior devices;

digital terminals to send and receive one or more digits of digital data signals to and from exterior devices; and signal conversion means to transform signals between said analog signals and said digital data signals, said signal conversion mean using three digit symmetric binary numbers (HEN2) as digital data signals, the three digit symmetric binary numbers (HEN2) being defined as a combination of signals in which at least one of two adjacent digits at any digit position of one or more digits of 2-based three digit redundant binary numbers with either one signal of three digits {n, o, p} each expressing value {−1, 0, 1} as a one-digit signal is a signal "o" expressing zero;

wherein said signal conversion means determines K, the number of integers lower than or equal to Nth digits of the three digit symmetric binary numbers (HEN2), by N, N being the number of digits of the three digit symmetric binary number (HEN2), wherein said signal converting means makes said number K become a three digit symmetric binary number (HEN2) "pon . . . on" with the (N+2)th digit being an odd or "pop . . . op" with the (N+1)th digit being an even by:
  (a) making the number K become an odd digit in the notation system of three digit symmetric binary numbers (HEN2);
  (b) making the most significant digit of the number K become "p", and
  (c) dividing the remaining lower even digits of the number K by 2 digits and the remaining digits being filled with "on" or op";

wherein the signal conversion means determines a region of the analog signals of an object of conversion, and divides said analog signal region into said number K sections, wherein said signal conversion means arranges corresponding said sections in descending or ascending order of analog signals with each value of said digital data signals lower than or equal to the Nth digit, wherein said signal conversion means determines a region of analog signals corresponding to individual digital data signals of three digit symmetric binary numbers (HEN2) with a pre-determined number of digits and converts between at least one of said digital data signals and said analog signals and the other or mutually converts between said digital data signals and said analog signals.

* * * * *